(12) United States Patent
Uetani et al.

(10) Patent No.: US 6,767,686 B2
(45) Date of Patent: Jul. 27, 2004

(54) CHEMICALLY AMPLIFYING TYPE POSITIVE RESIST COMPOSITION

(75) Inventors: Yasunori Uetani, Toyonaka (JP); Kenji Ohashi, Tsukuba (JP); Hiroshi Moriuma, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/988,006

(22) Filed: Nov. 16, 2001

(65) Prior Publication Data

US 2002/0146641 A1 Oct. 10, 2002

(30) Foreign Application Priority Data

Nov. 20, 2000 (JP) ........................................ 2000-352700

(51) Int. Cl.[7] .............................................. G03F 7/004
(52) U.S. Cl. .................... 430/270.1; 430/910; 430/922; 430/923
(58) Field of Search ................................ 430/270.1, 910, 430/922, 923, 914

(56) References Cited

U.S. PATENT DOCUMENTS

| | | | | |
|---|---|---|---|---|
| 5,919,596 A | * | 7/1999 | Hedrick et al. | 430/270.1 |
| 5,968,713 A | | 10/1999 | Nozaki et al. | |
| 6,013,416 A | | 1/2000 | Nozaki et al. | |
| 6,187,504 B1 | * | 2/2001 | Suwa et al. | 430/270.1 |
| 6,200,725 B1 | | 3/2001 | Takechi et al. | |
| 6,322,949 B2 | * | 11/2001 | Suwa et al. | 430/270.1 |
| 6,492,091 B2 | * | 12/2002 | Kodama et al. | 430/270.1 |

FOREIGN PATENT DOCUMENTS

DE 196 26 003 A1 1/1997
JP 2000-292917 * 10/2000

OTHER PUBLICATIONS

English translation of JP 2000–292917, Oct. 2000.*
Chemical Abstract DN 133:315619 of JP 2000–292917, Oct. 2000.*
Nagahara et al., Proceedings of SPIE, vol. 3999, No. 1, pp. 386–394 (Feb. 28, 2000).
Derwent Publications Ltd., XP–002189553 and Abstract of JP 2000292917; (Oct. 20, 2000).

* cited by examiner

Primary Examiner—Rosemary Ashton
(74) Attorney, Agent, or Firm—Birch, Stewart, Kolasch & Birch, LLP

(57) ABSTRACT

A chemically amplifying type positive resist composition suitable for use in the lithography utilizing an ArF or KrF excimer laser and excellent in the shape of profile is provided, which comprises a resin which has an alkali-soluble group protected by 2-alkyl-2-adamantyl group or 1-adamantyl-1-alkylalkyl group, and which, per se, is insoluble or slightly soluble in alkali but becomes soluble in alkali by the action of an acid; and a sulfonium salt acid generating agent represented by the following formula (I):

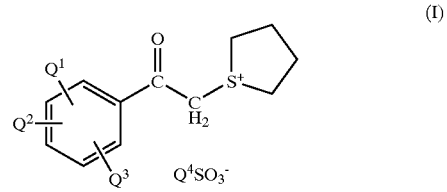

wherein $Q^1$, $Q^2$ and $Q^3$ independently represent hydrogen, hydroxyl, alkyl having 1 to 6 carbon atoms or alkoxy having 1 to 6 carbon atoms; and $Q^4$ represents perfluoroalkyl which may have a cyclic structure.

10 Claims, No Drawings

CHEMICALLY AMPLIFYING TYPE POSITIVE RESIST COMPOSITION

BACKGROUND OF THE INVENTION

1. Field of the Invention

The present invention relates to a chemical amplifying type positive resist composition used in the minute processing of a semiconductor.

2. Description of Related Art

A lithography process using a resist composition has usually been adopted in the minute processing of a semiconductor. In lithography, the resolution can be improved with a decrease in wavelength of exposure light in principle as expressed by the equation of Rayleigh's diffraction limit. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source.

A lens used in an ArF excimer laser exposure machine has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated by exposure and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No. 3, pages 387–398 (1996) by D. C. Hofer, are heretofore known as such resins.

Particularly, it has been reported that when a polymer or copolymer having an alkali-soluble group protected by 2-alkyl-2-adamantyl group or 1-adamantyl-1-alkylalkyl group as disclosed in Journal of Photopolymer Science and Technology, Vol. 9, No. 3, pages 475–487 (1996) by S. Takechi et al., and JP-A-9-73173 is used as a resin of a chemical amplifying type, a high dry etching resistance and a high resolution as well as a good adhesion to a substrate can be attained.

In fact, a polymer or copolymer having an alkali-soluble group protected by 2-alkyl-2-adamantyl group or 1-adamantyl-1-alkylalkyl group provides a high contrast and a high resolution. However, such a resin has a defect that the top of profile is liable to be broadened in T-top shape. It is considered that the cause of this defect resides in a bad affinity between a developing solution and a resin due to a strong hydrophobicity of the adamantly group as well as deactivation of the acid on the resist surface due to basic substances in the surrounding atmosphere. In order to resolve this problem, it is known that a good result may be obtained by adding a much amount of a basic quencher substance. The addition of a much amount of a quencher substance, however, causes lowering in resolution.

An object of the present invention is to provide a chemically amplifying type positive resist composition containing a resin component and an acid generating agent, which is suitable for use in lithography utilizing ArF excimer laser, KrF excimer laser or the like, and is satisfactory in various resist performance characteristics such as sensitivity, resolution, and adhesion to a substrate while providing an excellent profile shape.

SUMMARY OF THE INVENTION

The present invention provides a chemically amplifying type positive resist composition comprising a resin which has an alkali-soluble group protected by 2-alkyl-2-adamantyl group or 1-adamantyl-1-alkylalkyl group, and which, per se, is insoluble or slightly soluble in alkali but becomes soluble in alkali by the action of an acid; and a sulfonium salt acid generating agent represented by the following formula (I):

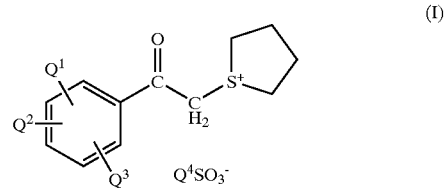

(I)

wherein $Q^1$, $Q^2$ and $Q^3$ independently represent hydrogen, hydroxyl, alkyl having 1 to 6 carbon atoms or alkoxy having 1 to 6 carbon atoms; and $Q^4$ represents perfluoroalkyl which may have a cyclic structure.

DETAILED DESCRIPTION OF EMBODIMENTS

The resin for constituting the resist composition of the invention is a resin which has an alkali-soluble group protected by 2-alkyl-2-adamantyl group or 1-adamantyl-1-alkylalkyl group, and which, per se, is insoluble or slightly soluble in alkali but becomes soluble in alkali due to the action of an acid. The alkali-soluble group includes carboxylic acid group, phenolic hydroxyl group, hexafluoroisopropanol group and the like. Usually carboxylic acid group is used for ArF excimer laser resists. Specific examples include resins having a polymerization unit represented by the following formula (IIa), (IIb), (IIc) or (IId):

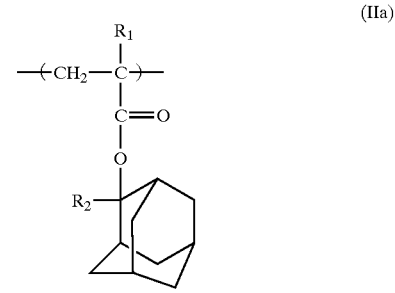

(IIa)

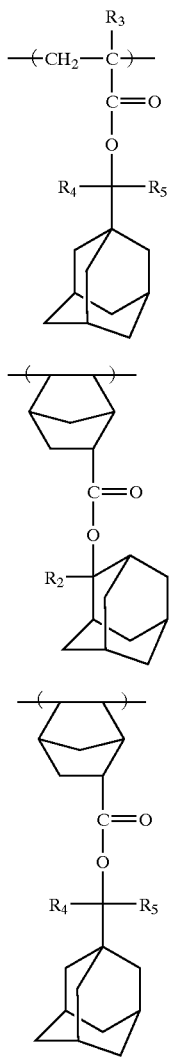

wherein $R_1$ and $R_3$ represent hydrogen or methyl; and $R_2$, $R_4$ and $R_5$ represent alkyl.

The polymerization units represented by the formulae (IIa) to (IId) secure transmittance of the resist and contribute to improvement of dry etching resistance in virtue of the presence of adamantane ring which is an alicyclic ring. In addition, 2-alkyl-2-adamantyl group and 1-adamantyl-1-alkylalkyl group in the units are cleaved by the action of an acid to generate a carboxylic acid. Therefore, the units contribute to enhancement of solubility of a resist film in alkali after exposure to a light.

$R_2$ in the formulae (IIa) to (IId) is alkyl. This alkyl can have, for example, about 1 to 8 carbon atoms. Usually, alkyl has advantageously a straight chain but may have a branched chain when it has three or more carbon atoms. Specific examples of $R_2$ includes methyl, ethyl, propyl, isopropyl, butyl and the like. Amongst them, a resin having methyl or ethyl, inter alia ethyl, as $R_2$ is preferable for adhesion of resists to a substrate and improvement in resolution.

Specific examples of monomers for leading to the polymerization units represented by the formulae (IIa) to (IId) include 2-methyl-2-adamantyl acrylate, 2-ethyl-2-adamantyl acrylate, 2-methyl-2-adamantyl methacrylate, 2-ethyl-2-adamantyl methacrylate, 1-adamantyl-1-methylethyl acrylate, 1-adamantyl-1-methylethyl methacrylate, 2-methyl-2-adamantyl 5-norbornene-2-carboxylate, 2-ethyl-2-adamantyl 5-norbornene-2-carboxylate, 1-(1-adamantyl)-1-methylethyl 5-norbornene-2-carboxylate and the like. Use of 2-adamantyl-2-alkyl (meth)acrylate as a monomer is particularly preferred because it provides an excellent resolution.

The resin may have a polymerization unit of monomers, such as those listed below, in addition to the above described polymerization units.

3-hydroxy-1-adamantyl (meth)acrylate,
3,5-dihydroxy-1-adamantyl (meth)acrylate,
α-(meth)acryloyloxy-γ-butyrolactone,
β-(meth)acryloyloxy-γ-butyrolactone,
maleic anhydride,
itaconic anhydride,
5-(meth)acryloyloxy-2,6-norbornanecarbolactone,
2-norbornene,
2-hydroxy-5-norbornene,
5-norbornene-2-carboxylic acid,
methyl 5-norbornene-2-carboxylate,
t-butyl 5-norbornene-2-carboxylate,
1-cyclohexyl-1-methylethyl 5-norbornene-2-carboxylate,
1-(4-methylcyclohexyl)-1-methylethyl 5-norbornene-2-carboxylate,
1-(4-hydroxycyclohexyl)-1-methylethyl 5-norbornene-2-carboxylate,
1-methyl-1-(4-oxocyclohexy)ethyl 5-norbornene-2-carboxylate,
1-(1-adamantyl)-1-methylethyl 5-norbornene-2-carboxylate,
1-methylcyclohexyl 5-norbornene-2-carboxylate,
2-methyl-2-adamantyl 5-norbornene-2-carboxylate,
2-ethyl-2-adamantyl 5-norbornene-2-carboxylate,
2-hydroxy-1-ethyl 5-norbornene-2-carboxylate,
5-norbornene-2-methanol,
5-norbornene-2,3-dicarboxylic acid anhydride,
(meth)acrylonitrile and the like.

Generally, the resin for the chemically amplifying type positive resist composition per se, is insoluble or slightly soluble in alkali. However, a part of groups is cleaved by the action of an acid and after then becomes soluble in alkali. In the resin specified in the present invention, 2-alkyl-2-adamantyl group and 1-adamantyl-1-alkylalkyl group are cleaved by the action of an acid. Therefore, resist compositions containing such a resin work positively. If necessary, the resin may contain another polymerization unit which is cleaved by the action of an acid.

Examples of another unit which is cleaved by the action of an acid include various esters of carboxylic acid, such as, alkyl esters exemplified by methyl ester and tert-butyl ester; acetal type esters such as methoxymethyl ester, ethoxymethyl ester, 1-ethoxyethyl ester, 1-isobutoxyethyl ester, 1-isopropoxyethyl ester, 1-ethoxypropyl ester, 1-(2-methoxy)ethoxyethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester; alicyclic esters such as isobornyl ester; and the like.

Monomers for leading to polymerization units having these carboxylic acid esters may either be acrylic derivatives such as methacrylic acid esters and acrylic acid esters or compounds in which a carboxylic acid ester group is bound to an alicyclic monomer such as norbornenecarboxylic acid ester, tricyclodecenecarboxylic acid ester and tetracyclodecenecarboxylic acid ester.

While the resin used in the invention varies depending on the kind of radiation for patterning exposure or group cleavable by the action of acid, it is generally preferred that the resin contains a polymerization unit having a group cleavable by the action of an acid within a range of 30 to 80% by mole. In addition, it is particularly advantageous that 20% by mole or more of the polymerization unit represented by the formulae (IIa) (IIb), (IIc) or (IId) based on the total resin is contained as a group cleavable by the action of an acid.

The acid generating agent, which is the other component of the resist composition, is a substance which is decomposed to generate an acid by applying a radiation such as a light, an electron beam or the like on the substance itself or on a resist composition containing the substance. The acid generated from the acid generating agent acts on said resin resulting in cleavage of the group cleavable by the action of an acid existing in the resin. In the present invention, a sulfonium salt compound represented by the formula (I) shown before is used as the acid generating agent.

In the formula (I), $Q^1$, $Q^2$ and $Q^3$ independently represent hydrogen, hydroxyl, alkyl having 1 to 6 carbon atoms or alkoxy having 1 to 6 carbon atoms. When alkyl or alkoxy has three or more carbon atoms, they may either be straight chain or branched chain. Specific examples of alkyl include methyl, ethyl, propyl, isopropyl, butyl, tert-butyl, pentyl, hexyl and the like; and examples of alkoxy include methoxy, ethoxy, propoxy, butoxy and the like. By using these compounds as the acid generating agent, T-top shape in the profile of resist becomes indistinct.

The sulfonium salt represented by the formula (I) can be produced according to a known process. For example, the salt can be produced according to the following reaction scheme applying a method described in J. Polymer Science, Polymer Chemistry Edition, Vol. 17, 2877–2892 (1979) by J. V. Crivello, et al.

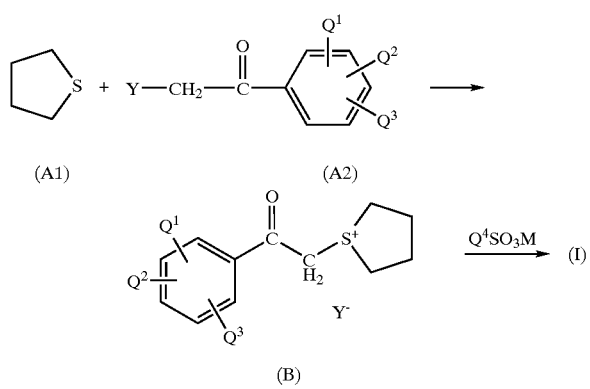

wherein $Q^1$, $Q^2$, $Q^3$ and $Q^4$ are as defined above, Y represents halogen such as bromine or iodine, and M represents alkali metal such as sodium and potassium or silver. (I) represent the sulfonium salt acid generating agent of the formula (I).

Briefly, the sulfonium salt represented by the formula (I) can be obtained by reacting a β-halogenoketone corresponding to the above formula (A2) on a sulfide compound corresponding to the above formula (A1) to give a sulfonium halide corresponding to the above formula (B), followed by the action of sulfonic acid metal salt corresponding to the formula $Q^4SO_3M$. These reactions are carried out in an appropriate solvent such as acetone, acetonitrile, nitromethane or the like. The sulfide compound of the formula (A1) is used preferably in 0.7 to 1.5 molar ratio, more preferably in 0.8 to 1.1 molar ratio, based on the β-halogenoketone of the formula (A2). The sulfonic acid metal salt of the formula $Q^4SO_3M$ may be used preferably in 0.7 to 1.2 molar ratio, more preferably in 0.8 to 1.0 molar ratio, based on the sulfide compound used for formation of the sulfonium halide of the formula (B). After the reaction is completed, the sulfonium salt of the formula (I) can be obtained by removing the produced metal halide by filtration or others, and then applying post-treatment such as concentration, recrystallization or the like.

Examples of perfluoroalkylsulfonate anion represented by $Q^4SO_3^-$ in the formula (I) include trifluoromethanesulfonate ion, perfluorobutanesulfonate ion, perfluorooctanesulfonate ion, perfluorocyclohexanesulfonate ion, perfluoro-4-ethylcyclohexanesulfonate ion and the like. Preferably, the prefluoroalkylsulfonate anion has 4 or more carbon atoms, because a distance of diffusion of the acid is shorter and the resolution is better. That is $Q^4$ preferably has 4 or more carbon atoms. $Q^4$ may optionally have a cyclic structure. As the cyclic structure, cycloalkyl having 5–10, more preferably 5–7, carbon atoms is preferable.

The resist composition of the invention is a combination of a resin which has an alkali-soluble group protected by 2-alkyl-2-adamantyl group or 1-adamantyl-1-alkylalkyl group, and which, per se, is insoluble or slightly soluble in alkali but becomes soluble in alkali due to the action of an acid, and a sulfonium salt represented by the above described formula (I) as an acid generating agent. If desired, another acid generating agent can be co-used together with the sulfonium salt.

Another acid generating agent which can be co-used, for example, includes other onium salt compounds such as sulfonium salts other than the sulfonium salt of the formula (I) and iodonium salts. Examples thereof include diphenyliodonium salts, triphenylsulfonium salts, alkylsulfonium salts such as cyclohexylmethyl(2-oxocyclohexyl)sulfonium salts described in JP-A-7-28237, 2-oxobutylthiacyclopentanium salts described in J. Photopolym. Sci. Technol., Vol. 13, No. 2, 235–236 (2000) by S. Iwasa, et al; organic halogen compound such as haloalkyltriazine compounds; sulfone compounds such as disulfones and diazomethanedisulfones; various sulfonic acid esters and the like.

More specifically, following compounds can be exemplified as acid generating agents which can be co-used with the sulfonium salt of the formula (I):

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate, 4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxocyclohexyl)sulfonium perfluorooctanesulfonate,
3,3-dimethyl-2-oxobutyl thiacyclopentanium trifluoromethanesulfonate,
3,3-dimethyl-2-oxobutyl thiacyclopentanium perfluorobutanesulfonate,
3,3-dimethyl-2-oxobutyl thiacyclopentanium perfluorooctanesulfonate,
3,3-dimethyl-2-oxobutyl thiacyclopentanium butanesulfonate,
3,3-dimethyl-2-oxobutyl thiacyclopentanium p-toluenesulfonate,
3,3-dimethyl-2-oxobutyl thiacyclopentanium camphorsulfonate,
3,3-dimethyl-2-oxobutyl dimethylsulfonium perfluorobutanesulfonate,
2-oxobutyl thiacyclopentanium perfluorobutanesulfonate,
dibutyl (3,3-dimethyl-2-oxobutyl) sulfonium perfluorobutanesulfonate,
3,3-dimethyl-2-oxobutyl thiacyclohexanium perfluorobutanesulfonate,
3,3-dimethyl-2-oxobutyl (1,4-thioxanium) perfluorobutanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

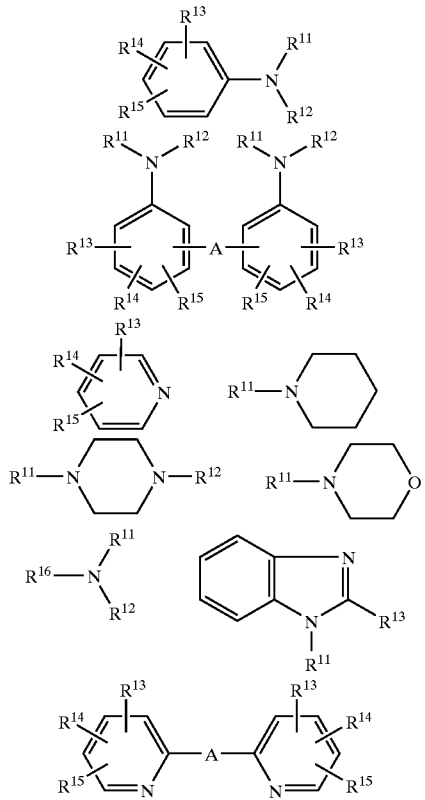

-continued

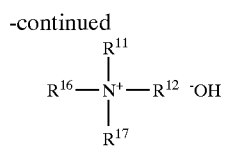

wherein $R^{11}$, $R^{12}$ and $R^{17}$ represent, independently each other, hydrogen, cycloalkyl, aryl or alkyl which may be optionally substituted with a hydroxyl, amino which may be optionally substitiuted with alkyl having 1 to 6 carbon atoms, or alkoxy having 1 to 6 carbon atoms; $R^{13}$, $R^{14}$ and $R^{15}$, which are same or different from each other, represent hydrogen, cycloalkyl, aryl, alkoxy or alkyl which may be optionally substituted with a hydroxyl, amino which may be optionally substitiuted with alkyl having 1 to 6 carbon atoms, or alkoxy having 1 to 6 carbon atoms; $R^{16}$ represents cycloalkyl or alkyl which may be optionally substituted with a hydroxyl, amino which may be optionally substitiuted with alkyl having 1 to 6 carbon atoms, or alkoxy having 1 to 6 carbon atoms; A represents alkylene, carbonyl, imino, sulfide or disulfide. The alkyl represented by $R^{11}$ to $R^{17}$ and alkoxy represented by $R^{13}$ to $R^{15}$ may have about 1 to 6 carbon atoms. The cycloalkyl represented by $R^{11}$ to $R^{17}$ may have about 5 to 10 carbon atoms and the aryl represented by $R^{11}$ to $R^{15}$ and $R^{17}$ may have about 6 to 10 carbon atoms. The alkylene represented by A may have about 1 to 6 carbon atoms and may be straight-chained or branched.

The resist composition of the present invention preferably contains the resin in an amount of 80 to 99.9% by weight, and the acid generating agent in an amount of 0.1 to 20% by weight based on the total solid component weight of the resist composition. Preferably, amount of the acid generating agent of the formula (I) is 0.1 by weight or more based on the total solid component weight of the resist composition. When a basic compound is used as a quencher, it is preferably contained in an amount in the range of 0.01 to 0.1% by weight based on the total solid component weight of the resist composition. The composition may also contain, if required, a small amount of various additives such as sensitizers, acid amplifiers, dissolution inhibitors, resins other than the above resin, surfactants, stabilizers, and dyes so far as the objects of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

RESIN SYNTHESIS EXAMPLE

A solution was prepared by charging 2-methyl-2-adamantyl methacrylate, 3-hydroxy-1-adamantyl acrylate and hexahydro-2-oxo-3,5-methano-2H-cyclopenta[b]furan-6-yl methacrylate in a molar ratio of 5:2.5:2.5 (20.0 parts/9.5 parts/9.5 parts) and adding methyl isobutyl ketone in two times the weight of total monomer. As an initiator, azobisisobutyronitrile was added thereto in an amount of 2% by mole based on the total monomer and the mixture was heated to 85° C. for about 6 hours. Then, a treatment in which the reaction solution was poured into a large amount of methanol to cause precipitation was applied and the obtained resin was purified by washing three times the wet cake of resin with methanol. As the result, a copolymer having a weight average molecular weight of about 12,200 was obtained. This resin is referred to as Resin A1.

Acid Generating Agent Synthesis Example 1
Synthesis of Acid Generating Agent B1

(1) Into a four-necked flask were charged 14.9 parts of phenacyl bromide and 75 parts of acetone, and 6.6 parts of tetrahydrothiophene was added dropwise thereto. The mixture was stirred at room temperature for 18 hours. The obtained crystals were filtered, washed with 80 parts of a mixed solvent consisting of tert-butyl methyl ether and acetone in a ratio 1:1 (weight base), 50 parts of tert-butyl methyl ether and dried to give 16.9 parts of tetrahydro-1-(2-oxo-2-phenylethyl) thiophenium bromide.

(2) Into a four-necked flask were charged 4.00 parts of tetrahydro-1-(2-oxo-2-phenylethyl)thiophenium bromide obtained in (1) and 160 parts of acetonitrile, and 2.62 parts of potassium trifluoromethanesulfonate was added thereto. The mixture was stirred at room temperature for 18 hours. Precipitated potassium bromide was removed by filtration and the filtrate was concentrated. To this was added 150 parts of chloroform and the mixture was stirred at room temperature for 16 hours. Insoluble matters were removed by filtration. The filtrate was concentrated and 22 parts of acetone was added. Insoluble matters were removed by filtration and the filtrate was concentrated further. The obtained residue from concentration was recrystallized from a mixed solvent of acetone and ethyl acetate to give 3.41 parts of the desired compound. The compound was identified to be tetrahydro-1-(2-oxo-2-phenylethyl)thiophenium trifluoromethanesulfonate represented by the formula shown below by $^1$H-NMR ("GX-270", manufactured by JEOL). This is referred to as PAG 1.

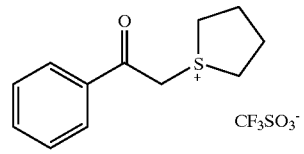

$^1$H-NMR (dimethylsulfoxide-d6, internal standard: tetramethylsilane), δ (ppm): 2.16–2.32 (m, 4H); 3.46–3.64 (m, 4H); 5.31 (s, 2H); 7.63 (m, 2H); 7.77 (m, 1H); 8.00 (m, 2H).

Acid Generating Agent Synthesis Example 2
Synthesis of Acid Generating Agent B2

Into a four-necked flask were charged 5.00 parts of tetrahydro-1-(2-oxo-2-phenylethyl)thiophenium bromide, 50 parts of acetonitrile and 2.5 parts of water, and a solution of 7.08 parts of silver perfluorobutanesulfonate in 21.3 parts of acetonitrile was added thereto. The mixture was stirred at room temperature for 4 hours. Precipitated silver bromide was removed by filtration and the filtrate was concentrated. The obtained residue from concentration was recrystallized from a mixed solvent of ethyl acetate and tert-butyl methyl ether to give 6.77 parts of the desired compound. The compound was identified to be tetrahydro-1-(2-oxo-2-phenylethyl)thiophenium perfluorobutanesulfonate represented by the formula shown below by $^1$H-NMR ("GX-270", manufactured by JEOL). This is referred to as PAG 2.

$C_4F_9SO_3^-$ $^1$H-NMR (chloroform-d1, internal standard: tetramethylsilane), δ (ppm): 2.23–2.36 (m, 2H); 2.42–2.53 (m, 2H); 3.59–3.77 (m, 4H); 5.35 (s, 2H); 7.45 (m, 2H); 7.63 (m, 1H); 7.99 (m, 2H).

Acid Generating Agent Synthesis Example 3
Synthesis of Acid Generating Agent B3

Into a four-necked flask were charged 3.00 parts of tetrahydro-1-(2-oxo-2-phenylethyl)thiophenium bromide and 120 parts of acetonitrile, and 5.62 parts of potassium perfluorooctanesulfonate was added thereto. The mixture was stirred at room temperature for 24 hours. Precipitated potassium bromide was removed by filtration and the filtrate was concentrated. To this was added 50 parts of chloroform and the mixture was stirred at room temperature for 16 hours. Insoluble matters were removed by filtration. The filtrate was dissolved in 200 parts of chloroform and the obtained chloroform solution was washed with water. After washing, the chloroform layer was concentrated and added dropwise to tert-butyl methyl ether. The obtained crystals were filtered and dried to give 4.66 parts of the desired compound. The compound was identified to be tetrahydro-1-(2-oxo-2-phenylethyl)thiophenium perfluorooctanesulfonate represented by the formula shown below by $^1$H-NMR ("GX-270", manufactured by JEOL). This is referred to as PAG 3.

$C_8F_{17}SO_3^-$ $^1$H-NMR (chloroform-d1, internal standard: tetramethylsilane), δ (ppm): 2.21–2.52 (m, 4H); 3.58–3.77 (m, 4H); 5.35 (s, 2H); 7.44 (m, 2H); 7.61 (m, 1H); 7.99 (m, 2H).

Examples 1–4 and Comparative Examples 1–3

A resist solution was prepared by mixing an acid generating agent and a resin in a composition and amount shown in Table 1,2,6-diisopropylaniline as a quencher in an amount shown in Table 1, together with 57 parts of PGMEA (propylene glycol monomethyl ether acetate) and 3 parts of GBL (γ-butyrolactone), and filtering through a filter made of a fluorine resin having a pore diameter of 0.2 μm.

PAG 4: 4-methylphenyldiphenylsulfonium perfluoromethanesulfonate,
PAG 5: 4-methylphenyldiphenylsulfonium perfluorobutanesulfonate,
PAG 6: 4-methylphenyldiphenylsulfonium perfluorooctanesulfonate.

TABLE 1

| Example No. | Resin | Acid generating agent | Quencher |
|---|---|---|---|
| Example 1 | A1 (10 parts) | PAG1 (0.3 part) | 0.0075 part |
| Example 2 | A1 (10 parts) | PAG2 (0.43 part) | 0.0075 part |
| Example 3 | A1 (10 parts) | PAG3 (0.6 part) | 0.0075 part |
| Example 4 | A1 (10 parts) | PAG3 (0.6 part)/ PAG6 (0.2 part) | 0.015 part |
| Comparative example 1 | A1 (10 parts) | PAG4 (0.11 part) | 0.0075 part |
| Comparative example 2 | A1 (10 parts) | PAG5 (0.135 part) | 0.0075 part |
| Comparative example 3 | A1 (10 parts) | PAG6 (0.2 part) | 0.0075 part |

*The amounts of the acid generating agent in Examples 1 to 3 and Comparative Examples 1 to 3 were adjusted so that respective amounts were equimolar.

The above resist solution was spin-coated to a film thickness after drying of 0.39 μm on a silicon wafer on which an organic anti-reflection-layer having a thickness of 1,600 Angstrom was formed by applying "DUV-30J-14" manufactured by Brewer Co. Ltd. and baking under conditions of 215° C. and 60 seconds. After applying the resist solution, prebaking was carried out on a direct hot plate at 100° C. for 60 seconds. The wafer having a resist film formed in this manner was exposed to a line-and-space pattern changing stepwise the irradiation amount. After exposure, post exposure bake was conducted on a hot plate at 130° C. for 60 seconds. Further, paddle development was conducted with a 2.38% aqueous solution of tetramethylammonium hydroxide for 60 seconds. The pattern obtained after the development was observed by a scanning electron microscope and its effective sensitivity, profile and resolution were measured according to the following methods.

Effective sensitivity: This was shown by the minimum irradiation amount at which a 0.18 μm line-and-space pattern was formed at 1:1.

Profile: This was the shape in cross section of 0.18 μm line-and-space pattern at the irradiation amount providing the effective sensitivity.

Resolution: This was shown by the minimum dimension of a line-and-space pattern separated at the irradiation amount providing the effective sensitivity.

Separately, the above resist solution was applied on a silicon glass wafer so that a film thickness of 0.39 μm after prebaking under the same conditions as above was formed, and the transmittance of the resist film at 193 nm was measured. The results are shown in Table 2.

TABLE 2

| Example No. | Effective sensitivity | Profile | Resolution | Transmittance |
|---|---|---|---|---|
| Example 1 | 50 mJ/cm$^2$ | Rectangular | 0.17 μm | 70% |
| Example 2 | 50 mJ/cm$^2$ | Rectangular | 0.15 μm | 70% |
| Example 3 | 53 mJ/cm$^2$ | Rectangular | 0.15 μm | 70% |
| Example 4 | 39 mJ/cm$^2$ | Rectangular | 0.15 μm | 59% |

TABLE 2-continued

| Example No. | Effective sensitivity | Profile | Resolution | Transmittance |
|---|---|---|---|---|
| Comparative example 1 | 41 mJ/cm² | T-top | 0.17 µm | 68% |
| Comparative example 2 | 47 mJ/cm² | T-top | 0.15 µm | 68% |
| Comparative example 3 | 47 mJ/cm² | T-top | 0.15 µm | 67% |

As shown above, the resists of Examples provided a profile of less T-top and more correct rectangular than the resist of Comparative Examples. In addition, the resists of Examples resulted less decrease in sensitivity and similar resolution.

The chemically amplifying type positive resist composition according to the present invention is suitable for use in the lithography utilizing an ArF or KrF excimer laser. In addition, it is a resist composition having good resist performances such as sensitivity, resolution and adhesion to a substrate and excellent in the shape of profile.

What is claimed is:

1. A chemically amplifying type positive resist composition comprising (A) a resin which has at least one polymerization unit selected from those represented by the following formula (IIa) or (IIb):

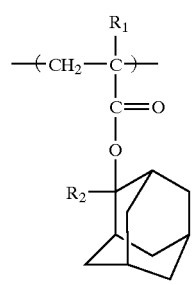
(IIa)

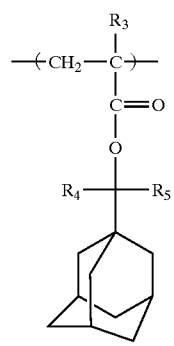
(IIb)

wherein $R_1$ and $R_3$ represent hydrogen or methyl, and $R_2$, $R_4$ and $R_5$ represent alkyl; and which, per se, is insoluble or slightly soluble in alkali but becomes soluble in alkali by the action of an acid; and (B) a sulfonium salt acid generating agent represented by the following formula (I):

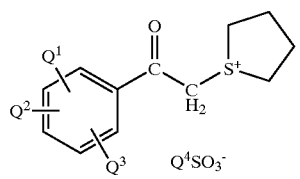
(I)

wherein $Q^1$, $Q^2$ and $Q^3$ independently represent hydrogen, hydroxyl, alkyl having 1 to 6 carbon atoms or alkoxy having 1 to 6 carbon atoms; and $Q^4$ represents perfluoroalkyl which may have a cyclic structure.

2. The positive resist composition according to claim 1 which contains the resin in an amount of 80 to 99.9% by weight, and the acid generating agent, including the sulfonium salt acid generating agent represented by formula (I) and another acid generating agent, in an amount of 0.1 to 20% by weight based on the total solid component weight of the resist composition.

3. The positive resist composition according to claim 1 wherein the perfluoroalkylsulfonate anion represented by $Q^4SO_3^-$ in the formula (I) has 4 or more carbon atoms.

4. The positive resist composition according to claim 1 wherein the resin contains a polymerization unit having a group cleavable by the action of an acid within a range of 30 to 80% by mole.

5. The positive resist composition according to claim 1 wherein 20% by mole or more of the polymerization unit of the resin is represented by the formulae (IIa) or (IIb).

6. The positive resist composition according to claim 1 wherein the polymerization unit of the resin is represented by the formulae (IIa).

7. The positive resist composition according to claim 1 wherein $R_2$ represents alkyl having one to eight carbon atoms.

8. The positive resist composition according to claim 1 wherein $R_2$ represents a member selected from the group consisting of methyl, ethyl, propyl, isopropyl and butyl.

9. The positive resist composition according to claim 1 wherein $R_2$ represents ethyl.

10. The positive resist composition according to claim 1 wherein the polymerization unit of the resin is represented by the formulae (IIb).

* * * * *